US012791641B2

(12) United States Patent
Greiser et al.

(10) Patent No.: US 12,791,641 B2
(45) Date of Patent: Nov. 10, 2026

(54) LOCAL COIL FOR THE MAGNETIC RESONANCE IMAGING OF A TEMPOROMANDIBULAR JOINT

(71) Applicants: Siemens Healthineers AG, Forchheim (DE); Dentsply Sirona Inc., York, PA (US); SIRONA Dental Systems GmbH, Bensheim (DE)

(72) Inventors: Andreas Greiser, Erlangen (DE); Stefan Wundrak, Bensheim (DE); Titus Lanz, Würzburg (DE); Stephan Biber, Erlangen (DE)

(73) Assignees: Siemens Healthineers AG, Forchheim (DE); Dentsply Sirona Inc., York, PA (US); SIRONA Dental Systems GmbH, Bensheim (DE)

( * ) Notice: Subject to any disclaimer, the term of this patent is extended or adjusted under 35 U.S.C. 154(b) by 131 days.

(21) Appl. No.: 18/692,498

(22) PCT Filed: Aug. 19, 2022

(86) PCT No.: PCT/EP2022/073190
§ 371 (c)(1),
(2) Date: Mar. 15, 2024

(87) PCT Pub. No.: WO2023/041286
PCT Pub. Date: Mar. 23, 2023

(65) Prior Publication Data

US 2024/0393414 A1 Nov. 28, 2024

(30) Foreign Application Priority Data

Sep. 17, 2021 (DE) ......................... 102021210305.7

(51) Int. Cl.
*G01R 33/3415* (2006.01)
*G01R 33/34* (2006.01)
(Continued)

(52) U.S. Cl.
CPC ... *G01R 33/3415* (2013.01); *G01R 33/34007* (2013.01); *G01R 33/34084* (2013.01); *G01R 33/543* (2013.01); *G01R 33/36* (2013.01)

(58) Field of Classification Search
CPC ......................... G01R 33/58; G01R 33/56509; G01R 33/567; G01R 33/56; G01R 33/34; G01R 33/563
See application file for complete search history.

(56) References Cited

U.S. PATENT DOCUMENTS

2012/0065496 A1* 3/2012 Stratton ................. G01R 33/28
600/421
2012/0146645 A1 6/2012 Rasche et al.
(Continued)

FOREIGN PATENT DOCUMENTS

CN 206788351 U 12/2017
DE 102009027119 A1 12/2010
(Continued)

OTHER PUBLICATIONS

English translation of EP 3489704 provided by Espacenet. (Year: 2025).*
(Continued)

*Primary Examiner* — Rishi R Patel
(74) *Attorney, Agent, or Firm* — Banner & Witcoff, Ltd.

(57) ABSTRACT

A local coil may have a mounting, at least one antenna, and a flexible element. The mounting may position the local coil in a specified position relative to the head of a patient, where the antenna may receive high-frequency signals in a frequency and power range of a magnetic resonance (MR) measurement. The flexible element may at least partly form the local coil on the surface contour of the patient's head. The local coil may at least partly surround the patient's head when the local coil is positioned during use, and a section of the local coil including the antenna can be positioned on the patient's temporomandibular joint using the mounting. The
(Continued)

Figure 1:
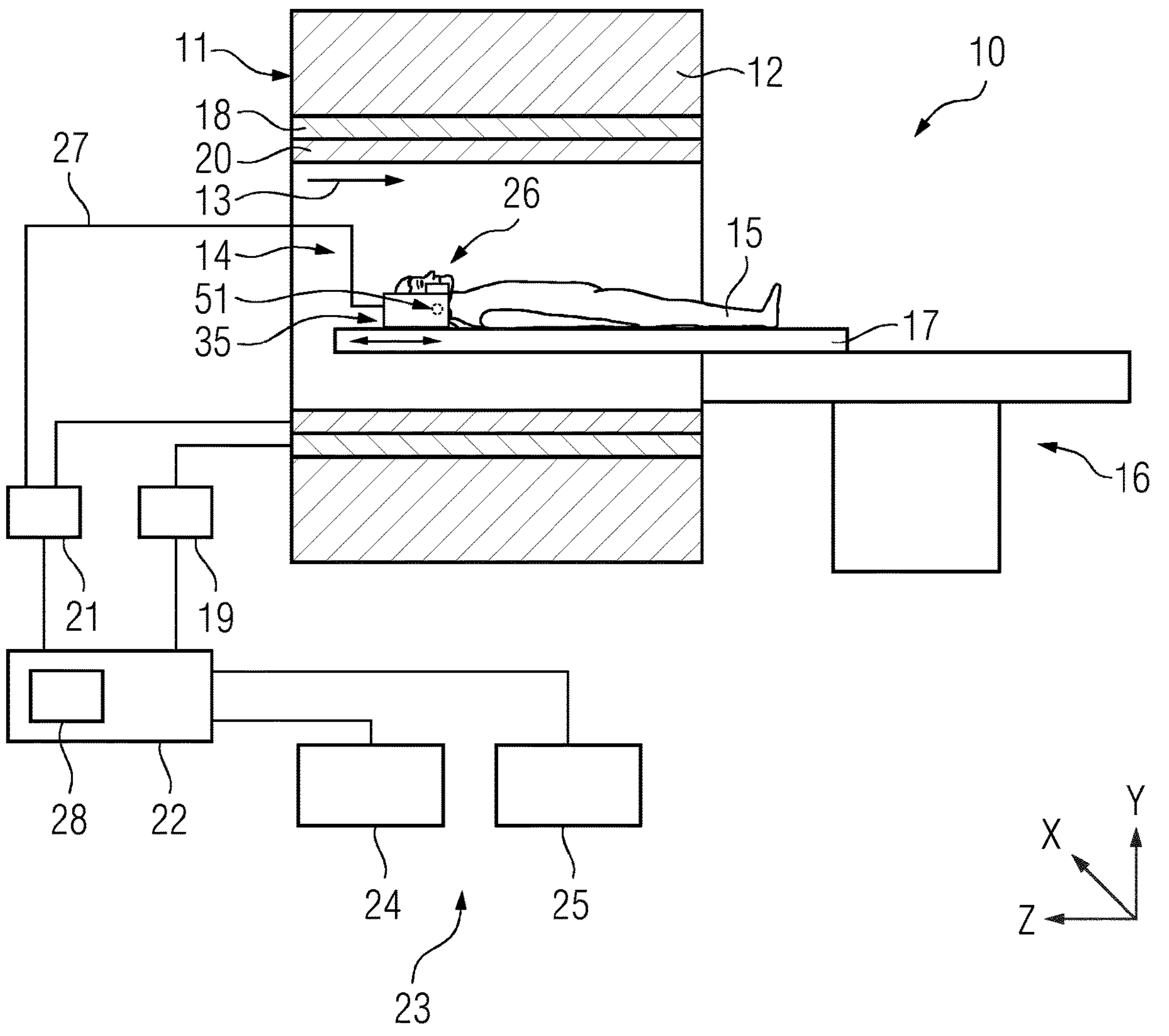

local coil may receive MR signals of the temporomandibular joint using the antenna. A MR device may include the local coil and detect MR signals of a region of the patient using the local coil.

16 Claims, 7 Drawing Sheets

(51) Int. Cl.
*G01R 33/36* (2006.01)
*G01R 33/54* (2006.01)

(56) References Cited

U.S. PATENT DOCUMENTS

| | | | |
|---|---|---|---|
| 2012/0288820 | A1 | 11/2012 | Choe et al. |
| 2013/0076361 | A1 | 3/2013 | Taniguchi et al. |
| 2013/0252196 | A1 | 9/2013 | Rasche et al. |
| 2017/0082705 | A1 | 3/2017 | Hou et al. |
| 2020/0158800 | A1 | 5/2020 | Taracila et al. |
| 2020/0256937 | A1 | 8/2020 | Iwasawa et al. |
| 2021/0278490 | A1* | 9/2021 | Leussler .......... G01R 33/34046 |

FOREIGN PATENT DOCUMENTS

| | | | |
|---|---|---|---|
| DE | 102015207681 | A1 | 10/2016 |
| EP | 3489704 | A1 | 5/2019 |

OTHER PUBLICATIONS

English translation of DE102015207681A1 provided by Espacenet. (Year: 2026).*
Sedlacik, Jan et al.: "Optimized 14+1 Receive Coil Array and Position System For 30 High-Resolution MRI of Dental and Maxillomandibular Structures", Dentomaxillofacial Radiology; 2016; vol. 45; No. 20150177; pp. 1-6; 2016.
Noras MRI Products "Mandibula 15-Ch Dental Spule", https://www.noras.de/mri-produkte/mandibula-15-ch-dental-spule/; Date of screenshot: Aug. 6, 2023.
Ludwig U. et al.: "Dental MRI using wireless intraoral coils", Sci Rep 6, 23301 (2016), https://doi.org/10.1038/srep23301.
Dec. 9, 2022 (PCT) International Search Report and Written Opinion (with translation).

* cited by examiner

LOCAL COIL FOR THE MAGNETIC RESONANCE IMAGING OF A TEMPOROMANDIBULAR JOINT

CROSS REFERENCE TO RELATED APPLICATIONS

This patent application is a U.S. national stage application of International Application No. PCT/EP2022/073190, filed Aug. 19, 2022, which claims priority to German Patent Application No. 10 2021 210 305.7, filed Sep. 17, 2021. Each of these applications is incorporated herein by reference in its entirety.

BACKGROUND

Field

The disclosure relates to a local coil having a mounting and at least one antenna, wherein the mounting is embodied to position the local coil in a specified position relative to a patient's head and wherein the at least one antenna is embodied to receive radio-frequency signals in a frequency and power range of a magnetic resonance measurement. The disclosure additionally relates to a magnetic resonance apparatus with a local coil, wherein the magnetic resonance apparatus is embodied to acquire magnetic resonance signals from a diagnostically relevant region of the patient's head by means of the local coil.

Related Art

Diseases of the teeth and periodontium, such as, for example, caries or periodontitis, are nowadays usually diagnosed using X-ray based imaging methods. Herein, conventional or digital X-ray projection methods are mainly used, and recently also three-dimensional X-ray methods. One example of a three-dimensional X-ray method is digital volume tomography which can be used for imaging teeth and the viscerocranium.

A major disadvantage of X-ray methods is the need to use ionizing radiation for imaging. Magnetic resonance imaging is an imaging method that avoids ionizing radiation. This typically enables better soft tissue contrast than X-ray methods and assists three-dimensional imaging of an object under examination as standard. Furthermore, magnetic resonance topography enables imaging of cysts and detection of dentine degradation before this can be detected by an X-ray procedure.

Magnetic resonance tomography thus represents a potential alternative to known X-ray methods when imaging a dental region and/or a jaw region and diagnosing dental diseases in the object under examination.

Magnetic resonance tomography is a known imaging method with which magnetic resonance images of an interior of the object under examination can be generated. When performing magnetic resonance imaging, the object under examination is usually positioned in a strong, static and homogeneous basic magnetic field (B0 magnetic field) of a magnetic resonance apparatus. The basic magnetic field can have magnetic field strengths of 0.2 tesla to 7 tesla, so that nuclear spins of the object under examination are aligned along the basic magnetic field. In order to trigger so-called nuclear spin resonances, radio-frequency signals, so-called excitation pulses (B1 magnetic field), are radiated into the object under examination. Each excitation pulse causes the magnetization of specific nuclear spins of the object under examination to deviate from the basic magnetic field by an amount which is also known as the flip angle. An excitation pulse can have an alternating magnetic field with a frequency which corresponds to the Larmor frequency at the respective static magnetic field strength. The excited nuclear spins can exhibit a rotating and decaying magnetization (nuclear spin resonance) which can be acquired as a magnetic resonance signal using special antennas. Magnetic gradient fields can be superimposed on the basic magnetic field for spatial encoding of the nuclear spin resonances of the object under examination.

The received magnetic resonance signals are typically digitized and stored as complex values in a k-space matrix. This k-space matrix can be used as the basis for reconstructing magnetic resonance images and determining spectroscopy data. A magnetic resonance image is typically reconstructed using a multidimensional Fourier transform of the k-space matrix.

Due to the avoidance of ionizing radiation, magnetic resonance tomography is particularly suitable for continuous diagnostic monitoring of dental diseases and/or tooth development as part of a longitudinal imaging study. In longitudinal imaging studies, a plurality of imaging examinations are usually carried out in order to determine a progression of a disease or an outcome of therapeutic treatment over a specified period of time. However, diagnostically relevant areas of the jaw region of a patient, such as, for example, an oral cavity, temporomandibular joint, dentition, dental arch or tooth, provide a small volume available for generating magnetic resonance signals. Furthermore, conventional volume and surface coils such as, for example, head coils and overlay coils, have a relatively large distance to the diagnostically relevant area. However, a large distance can increase the signal-to-noise ratio of acquired magnetic resonance signals and thus reduce the quality of magnetic resonance images reconstructed therefrom. Furthermore, a use of overlay coils positioned in a facial area of the patient, but also the use of helmet or birdcage coils that enclose the patient's head and thus restrict the patient's field of vision, can be perceived as disturbing.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 2:
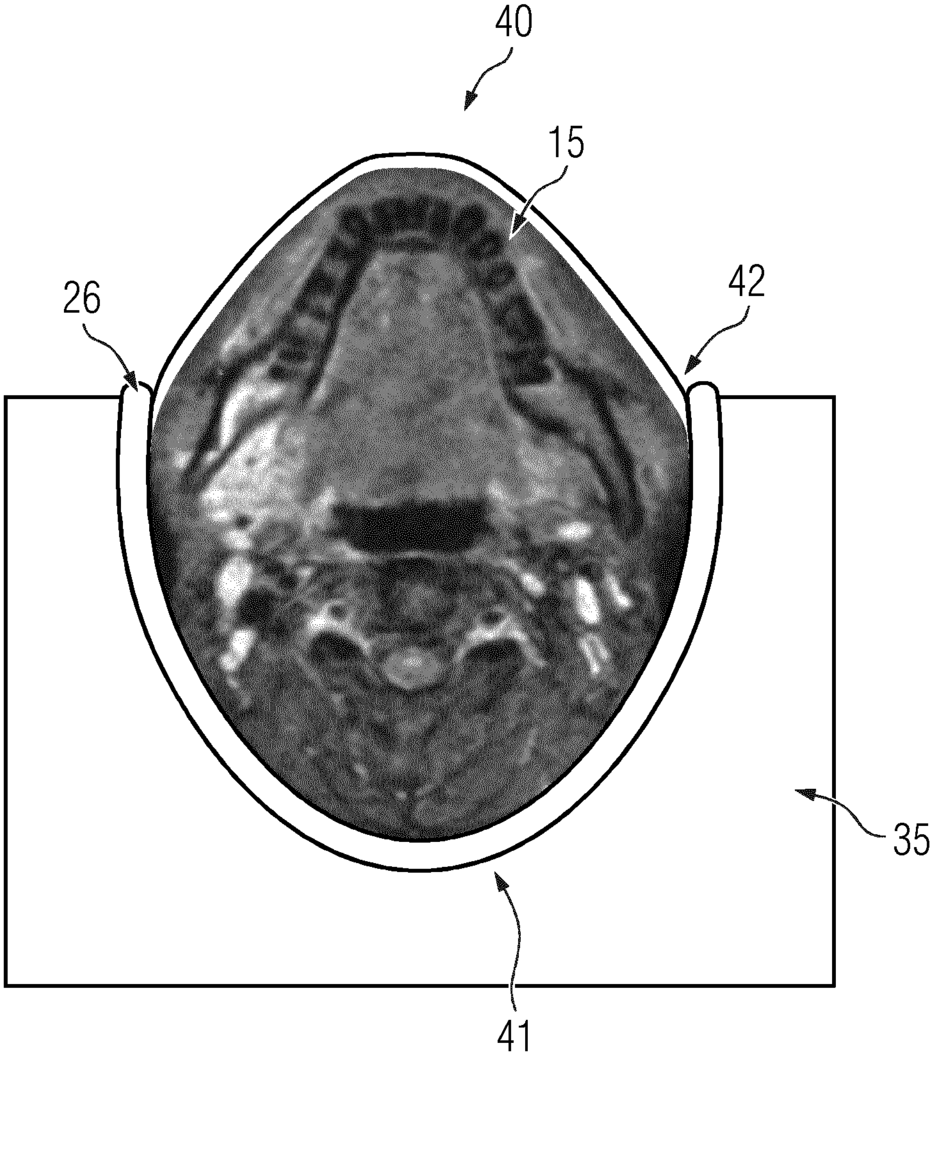
Figure 3:
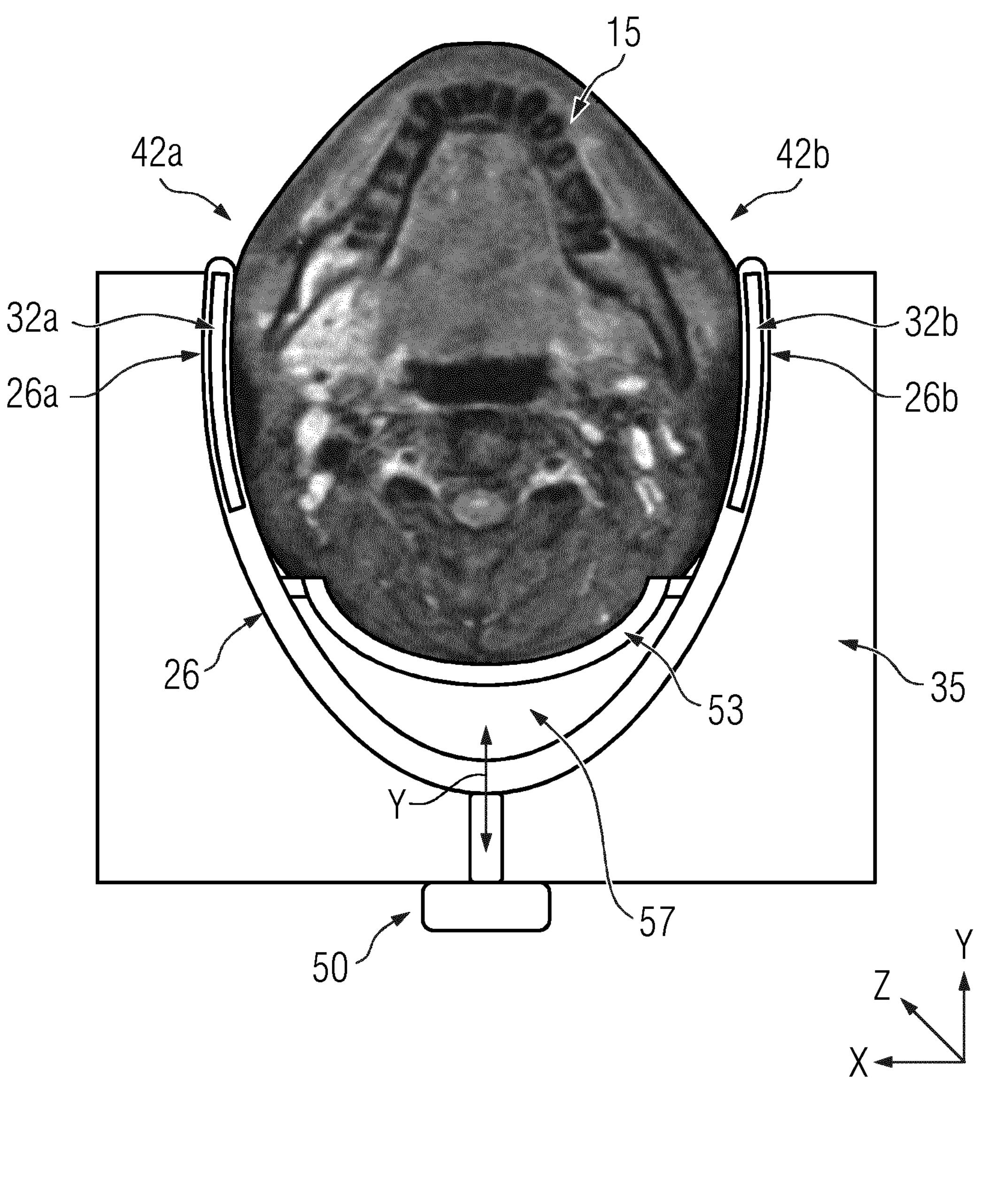
Figure 4:
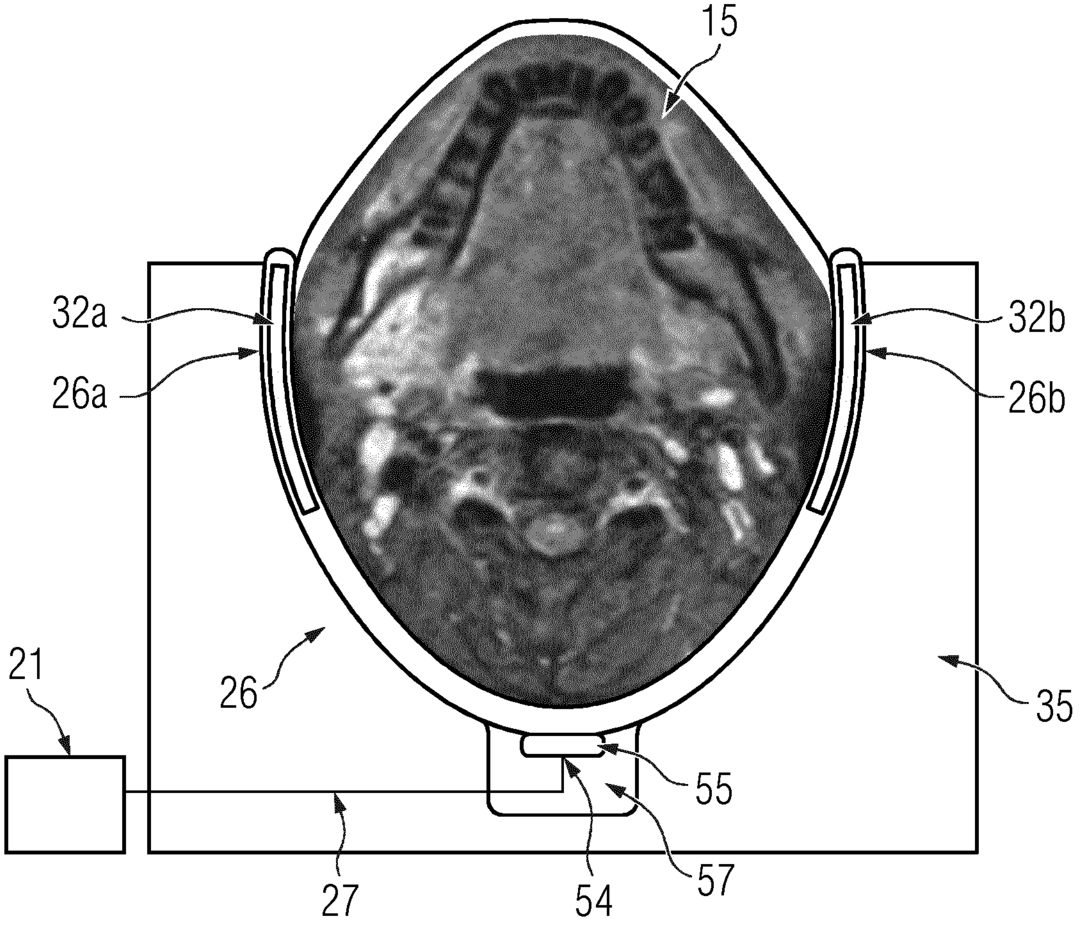
Figure 5:
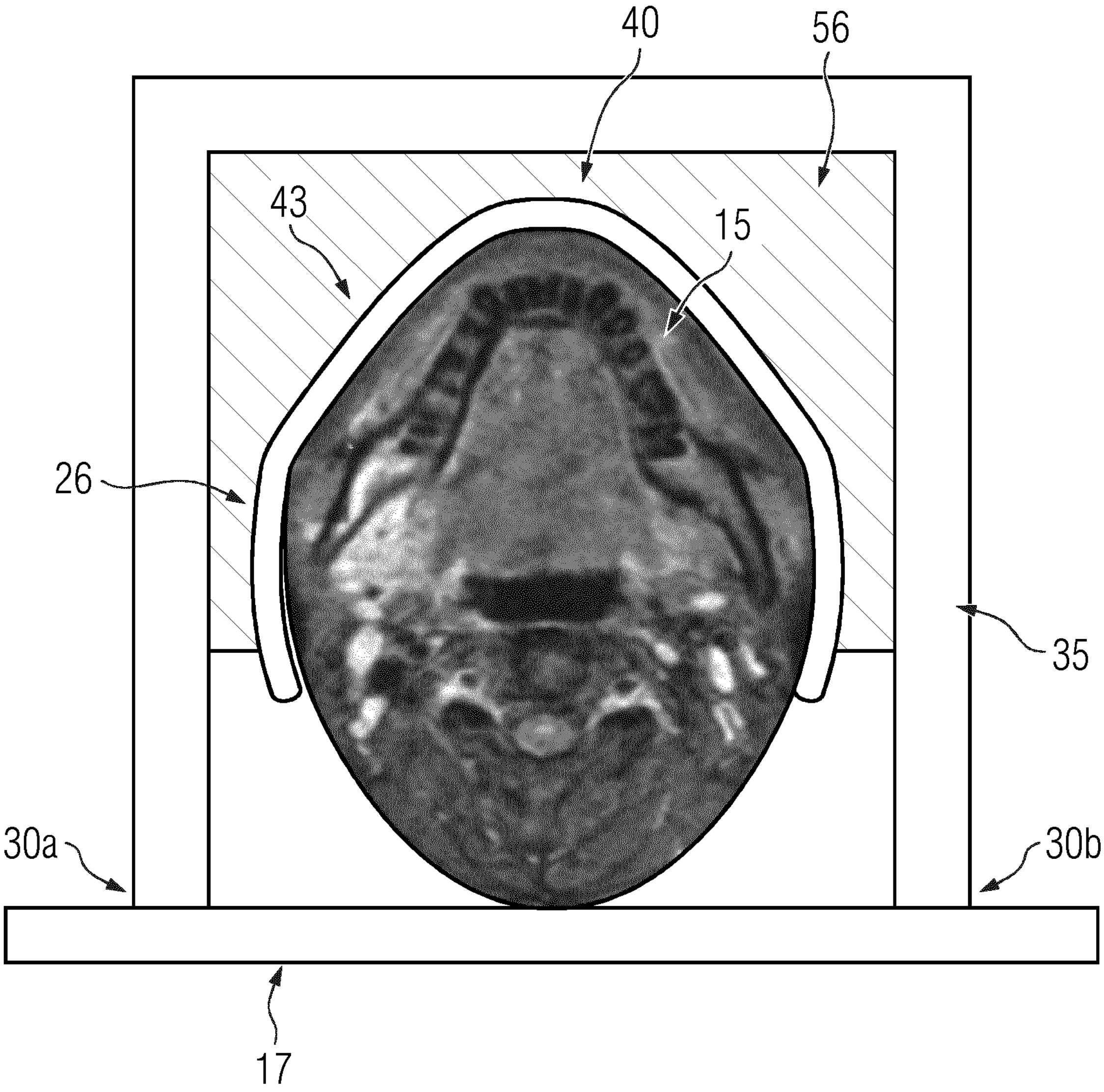
Figure 6:
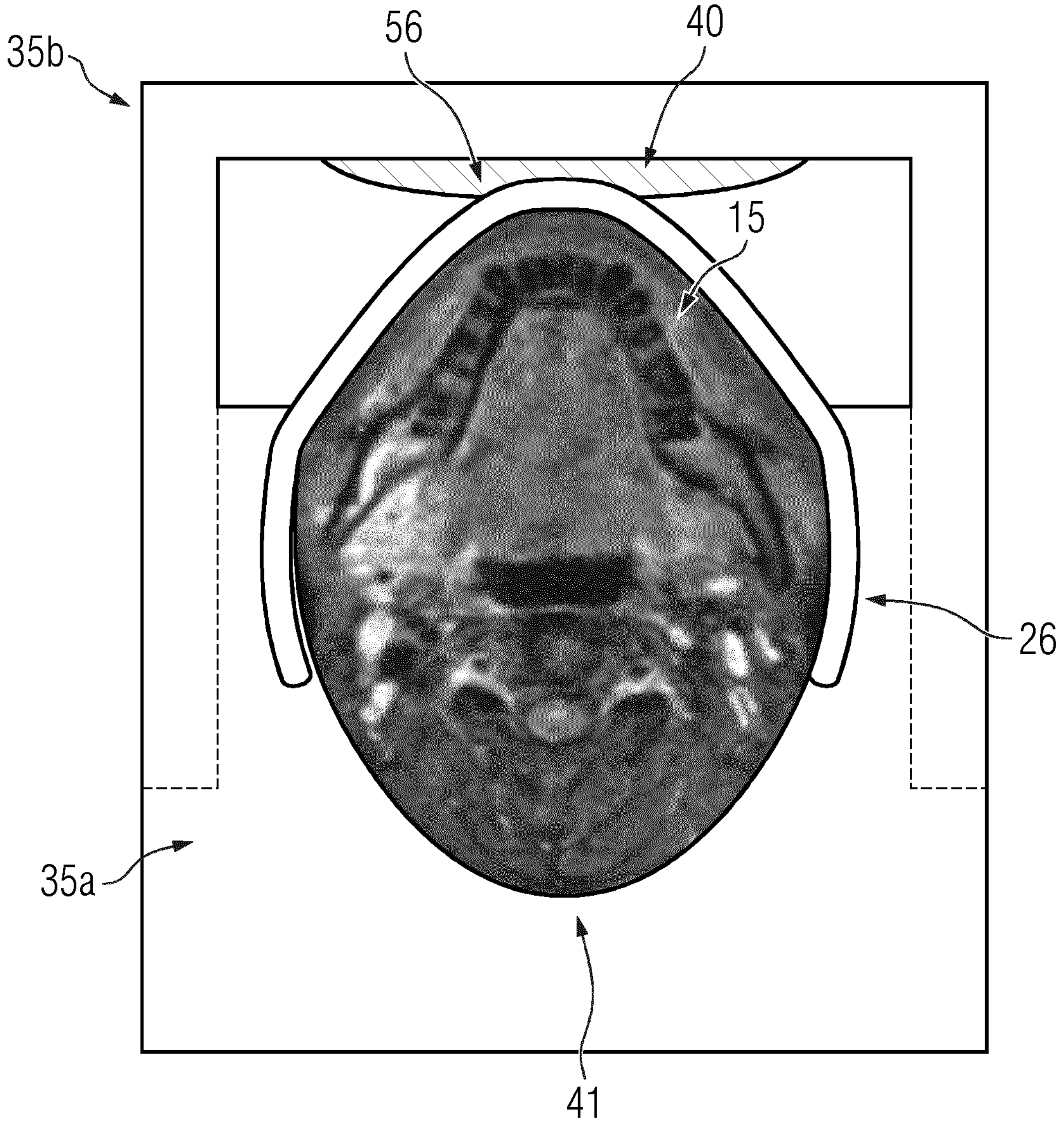
Figure 7:
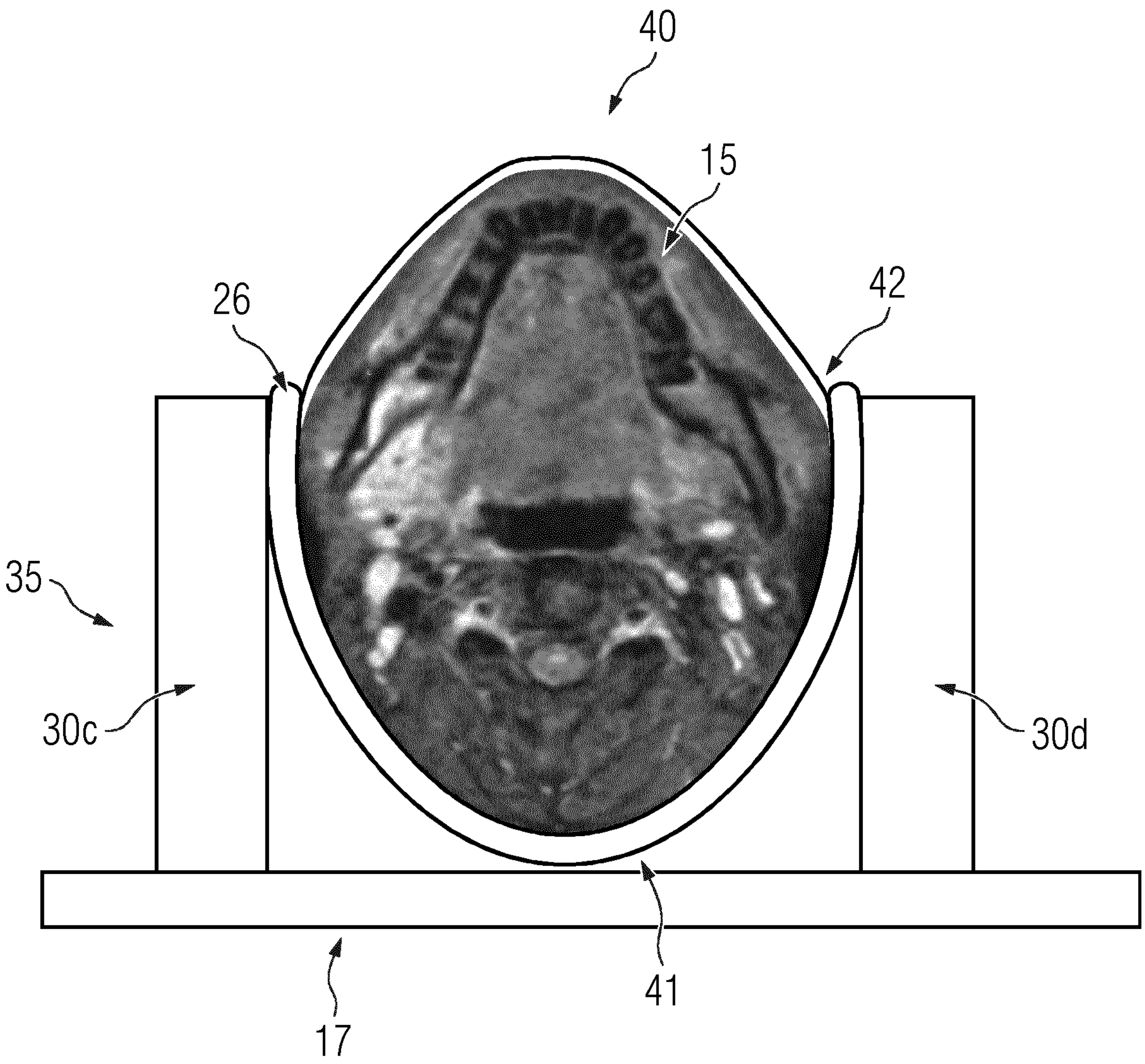

FIG. 1 a schematic representation of an exemplary embodiment of a magnetic resonance apparatus according to the disclosure, FIG. 2 a schematic representation of an exemplary embodiment of a local coil according to the disclosure, FIG. 3 a schematic representation of an exemplary embodiment of a local coil according to the disclosure, FIG. 4 a schematic representation of an exemplary embodiment of a local coil according to the disclosure, FIG. 5 a schematic representation of an exemplary embodiment of a local coil according to the disclosure, FIG. 6 a schematic representation of an exemplary embodiment of a local coil according to the disclosure, FIG. 7 a schematic representation of an exemplary embodiment of a local coil according to the disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the disclosure is to provide a local coil that enables magnetic resonance images of the jaw region of the patient to be recorded with high quality.

The local coil according to the disclosure may comprises a mounting and at least one antenna, wherein the mounting may be adapted to position the local coil in a specified position relative to a patient's head and wherein the at least one antenna may be adapted to receive radio-frequency signals in a frequency and power range of a magnetic resonance measurement.

An antenna can represent a coupling element between guided electromagnetic waves in signal conductors and unguided electromagnetic waves, i.e. in free space. The antenna is in particular embodied to receive electromagnetic waves in the range of a magnetic resonance frequency of a magnetic resonance-active atomic nucleus. Electromagnetic waves relevant for magnetic resonance measurements can be radio-frequency signals or magnetic resonance signals with frequencies between 1 and 500 MHz, such as between 10 and 300 MHz. The magnetic resonance signals from the usual atomic nuclei to be examined can have a lower power of a few microwatts to several milliwatts.

A signal conductor may be an electrically conductive wire. The wire of the signal conductor can have an oval or polygonal cross section and be suitable for continuously transmitting the powers specified above. It is also conceivable that the signal conductor is embodied as a conductor track on a printed circuit board. The signal conductor can be substantially made of copper. However, other electrically conductive metals, such as, for example, gold, silver or aluminum, are also conceivable.

The at least one antenna of the local coil according to the disclosure may be adapted to protect against accidental contact to protect a patient from voltages and/or burns. For this purpose, the signal conductor of the antenna can, for example, have a coating and/or a covering made of plastic. Suitable plastics are, for example, polytetrafluoroethylene (PTFE) or various polysiloxanes. On reception of a magnetic resonance signal, a current can be induced in the signal conductor for transmission to a receiver unit of a magnetic resonance apparatus by means of a suitable signal connection, such as, for example, an electrical connecting lead or wireless signal transmission. An electrical connecting lead can, for example, be a coaxial cable with a shield to avoid electromagnetic interference from the environment.

It is conceivable that the local coil has an electronic circuit which is connected to the at least one antenna. The electronic circuit can comprise an electronic component or a combination of a plurality of electronic components, such as, for example, transistors, resistors, capacitors, diodes, conductor tracks and the like. The electronic circuit can in particular have a protective circuit which is suitable for protecting at least one antenna against overloading. In order to avoid magnetic forces of attraction, standing waves, heating and comparable undesirable effects, the electronic circuit can have a high proportion of non-magnetic materials and corresponding standing wave barriers and/or baluns. The electronic circuit may have a printed circuit board (PCB) or a comparable substrate which is suitable for accommodating the electronic components in a specified position relative to one another.

Obviously, the local coil according to the disclosure can comprise a plurality of antennas or arrays of antennas according to an above-described embodiment. Herein, the antennas can be arranged at a distance from one another, adjacent to one another or partially overlapping. It is also conceivable that the antennas are arranged in the form of a grid or matrix.

In one embodiment, the local coil according to the disclosure has a transmitting antenna which is configured to emit a radio-frequency signal in the direction of the patient. Depending on the basic magnetic field of a magnetic resonance apparatus, the radio-frequency signal emitted by the transmitting antenna can, for example, be in a power range from a few watts to several kilowatts. In an exemplary embodiment, the radio-frequency signal emitted by the transmitting antenna represents a B1 magnetic field. A part or section of the local coil with the transmitting antenna can, for example, be a transmitter unit of the local coil. However, it is also conceivable that the transmitting antenna is also a receiving antenna which may be adapted to receive magnetic resonance signals from the patient's head. The transmitting antenna can furthermore correspond to the at least one antenna.

The mounting of the local coil according to the disclosure can have two struts or support elements which, when the local coil is positioned appropriately for the application, flank or enclose the patient's head on the left and right side of the head. It is also conceivable that the mounting has a concave indentation, in particular a U-shaped or shell-shaped indentation which may be adapted to accommodate the patient's head. Herein, the shell-shaped indentation can in particular be shaped like a surface contour of a dorsal side, a ventral side and/or a parietal bone of a patient's head.

The mounting can comprise a positioning unit which may be adapted to position the local coil relative to the patient and/or a patient positioning apparatus. Herein, a patient positioning apparatus can be any structure that assists the patient in maintaining a specified position and/or posture during a magnetic resonance measurement. The patient positioning apparatus can in particular be embodied to support a body region of the patient in a seated, prone and/or standing posture.

The mounting can furthermore have a fastening element which may be adapted to mechanically connect the local coil to the mounting in a specified position relative to the mounting. For this purpose, the fastening element and/or the mounting can have any mechanism, such as, for example, a latching mechanism, a clamping mechanism, a tensioning mechanism, a screw mechanism, a plug-in mechanism or the like, which may be adapted to connect the local coil to the mounting in a material-bonding and/or form-fitting manner.

The mounting can in particular be embodied to accommodate the local coil in different spatial arrangements. For example, the local coil can be positioned in the specified position relative to the patient's head, in particular the dorsal side, but also the ventral side of the patient's head, by means of the mounting.

In an exemplary embodiment, at least a section of the mounting can be shaped like a surface contour of the patient's head. The section of the mounting can be shaped in such a way that, when the local coil is connected to the mounting, the local coil is brought into a shape which corresponds to a surface contour of the patient's head by deforming the flexible element. In an exemplary embodiment, the at least one antenna of the local coil has a flexible signal conductor which is shaped like the surface contour of the patient's head when the flexible element of the local coil is deformed.

The mounting enables the local coil according to the disclosure to be positioned in the specified position relative to the patient's head in a reproducible and/or particularly time-efficient way.

The local coil has a flexible element which may be adapted to enable the local coil to be shaped to a surface contour of the patient's head, wherein, when positioned appropriately for the application, the local coil at least partially encloses the patient's head and wherein a section of the local coil with the at least one antenna can be positioned on a temporomandibular joint of the patient by means of the mounting.

A flexible element may be reversibly deformable. The local coil can be made in one piece from the flexible element or can have segments that enable reversible deformation of the flexible element. A segment of the flexible element can, for example, be a hinge, a joint, a bearing or the like. It is conceivable that the flexible element can be reversibly deformed by means of a segment. Herein, the segment can have an elastic and/or a dimensionally stable material.

In an exemplary embodiment, the flexible element has a plastically or elastically deformable material. The flexible element can also be made entirely of a plastically or elastically deformable material. Examples of flexible materials are plastics such as polyethene, polyurethane, polyamide, polyester, but in particular also elastomers and elastic foams. In addition, naturally-based materials, such as, for example, rubber or fibrous materials, are also conceivable. In an exemplary embodiment, the flexible element substantially consists of foam, fibrous material or the like in order to achieve a low density and thus a low weight. The flexible element can be deformable in such a way that the local coil can be shaped to individual geometries of a plurality of different jaw regions of different patients. In an exemplary embodiment, the flexible element can be deformed by means of a manual force applied by an operator of the magnetic resonance apparatus or by the patient.

Shaping the local coil to the surface contour of the patient's head can, for example, comprise deforming or adjusting a surface contour of the local coil. Herein, the local coil can be in contact with the surface of the skin and/or the hair on the patient's head (for example, by the application of pressure). However, it is also conceivable that the local coil is shaped to the surface contour of the patient's head without (direct) contact with the skin surface. For example, in a position appropriate for the application on the patient's head, the local coil can have a maximum distance of 2 cm, 1 cm or 0.5 cm and be shaped like a surface contour of the head. Thus, shaping of the local coil to a surface contour of the head can also be understood to mean shaping like the surface contour of the head by the flexible element of the local coil, wherein the local coil can be spaced apart from the surface contour of the head.

In a position appropriate for the application on the patient's head, the local coil can be aligned substantially parallel along the surface contour of the patient's head. Herein, the local coil can have a curvature which substantially corresponds to the curvature of the surface contour of the patient's head. A surface contour of the head can in particular be a surface contour of the back of the head (dorsal side of the head), a jaw region (ventral side of the head) and/or a parietal bone of the patient. In an exemplary embodiment, when positioned appropriately for the application on the patient's head, the local coil is shaped like the surface contour of the back of the head, the jaw region or the parietal bone. Herein, the local coil can enclose a patient's mouth region like a surgical mask. However, it is also conceivable that, when positioned appropriately for the application, the local coil is positioned like a headset on the patient's parietal bone. In an exemplary embodiment, the local coil is positioned on the back of the patient's head and encloses it along a trajectory up to the patient's temporomandibular joints.

In an exemplary embodiment, the local coil only encloses part of the patient's head along a section of the patient's longitudinal axis. For example, the local coil only encloses the patient's head along a segment of an imaginary arc enclosing the outside of the patient's head. It is conceivable that the segment of the imaginary arc is defined by a center point angle of max. 300°, max. 270°, max. 240° or max. 210°.

It is conceivable that, in an initial state (for example a non-deformed state or a planar configuration), a body or shape of the local coil is designed in such a way that shaping the local coil to a dorsal side of the patient's head is assisted. For this purpose, the local coil can have a substantially planar cuboid shape. However, the shape of the local coil can also be homeomorphic to a cuboid. For example, in the planar configuration, the local coil can already have a V-shape or a U-shape in order to be better adjusted to a conical shape of a lower part of the back of the head of a plurality of patients. This advantageously enables uneven stretching of the local coil when shaping the local coil like or to the dorsal side of the patient's head to be reduced or avoided.

The section of the local coil with the at least one antenna can be positioned by means of the mounting on the patient's temporomandibular joint in such a way that the ventral side of the patient is not affected by either the mounting or the local coil. This can mean that, when the local coil is positioned on the parietal bone or the back of the head, a patient's face is completely free of parts of the local coils. During a magnetic resonance measurement of a temporomandibular joint, impairment of the patient's vision and/or breathing can thus advantageously be excluded.

The local coil may be adapted to receive magnetic resonance signals from the patient's temporomandibular joint by means of the at least one antenna. Herein, the local coil is in particular shaped in such a way that the section of the local coil with the at least one antenna is positioned on the patient's temporomandibular joint. Furthermore, the local coil can be embodied to wrap round the patient's head by at least 180°, 200° or 220°. This can mean that the local coil encircles the dorsal side of the patient's head from a patient's left temporomandibular joint to a patient's right temporomandibular joint. Herein, a first end of the local coil can be positioned on the patient's left temporomandibular joint and a second end of the local coil can be positioned on the patient's right temporomandibular joint. In an exemplary embodiment, herein, the first end of the local coil has a first antenna positioned on the patient's left temporomandibular joint. Likewise, the second end of the local coil can have a second antenna positioned on the patient's right temporomandibular joint. Herein, the first antenna and the second antenna can be separate antennas or match one another.

The provision of a local coil according to the disclosure enables any impairment of the patient's field of vision and/or the patient's breathing as a result of positioning the local coil in the position appropriate for the application to be advantageously reduced or avoided. This can increase the patient's comfort during a magnetic resonance measurement and advantageously reduce the risk of the magnetic resonance measurement being aborted. A further advantage of the local coil according to the disclosure is that the local coil is positioned on the dorsal side of the head during a magnetic resonance measurement of the temporomandibular joint. This enables access to the patient's jaw region to be simplified or improved, for example when performing imaging methods in which an opening angle of the temporomandibular joint is fixed by positioning a wedge in the patient's mouth.

Furthermore, the local coil according to the disclosure advantageously enables the performance of a magnetic resonance measurement of a plurality of diagnostically relevant regions of the patient's head, such as, for example, the temporomandibular joint and dentition, but also a section of a spinal column. Shaping the local coil to the surface contour of the head can in particular enable a short distance between the diagnostically relevant region and an antenna of the local coil to be ensured, including for different patients. This advantageously enables the signal-to-noise ratio to be increased and/or the number of required and/or dedicated local coils for examining different diagnostically relevant regions to be reduced.

In one embodiment, the mounting of the local coil according to the disclosure may be adapted to hold the local coil in the specified relative position on a dorsal side of the head and/or a parietal bone of the patient, wherein the at least one antenna is positioned on the patient's temporomandibular joint.

In an exemplary embodiment, the mounting is also wrapped round the dorsal side of the head and/or the parietal bone. Herein, the local coil can be shaped to the surface contour of the dorsal side and/or the parietal bone by means of the mounting. Furthermore, the local coil can also be positioned in any intermediate position between the parietal bone and the dorsal side of the head. When the local coil is positioned appropriately for the application, the section of the local coil with the at least one antenna is always positioned on a temporomandibular joint of the patient.

It is conceivable that the mounting may be adapted to wrap round the patient's head like a headset and hold the local coil in the specified relative position on the patient's parietal bone. This embodiment is in particular advantageous with a magnetic resonance measurement on a standing or seated patient, since the mounting and/or the local coil are held on the patient's head by gravitational force.

It is additionally conceivable that the mounting has a concave or U-shaped indentation which may be adapted to receive the dorsal side of the patient's head. Herein, in an exemplary embodiment, the local coil is positioned between the mounting and the dorsal side of the patient's head and shaped like the surface contour of the dorsal side of the head. This embodiment is in particular advantageous with a magnetic resonance measurement on a prone patient, since the local coil is locked in the mounting by the weight of the patient's head and is shaped to the surface contour of the dorsal side. The mounting can in particular have a positioning unit which may be adapted to position the mounting relative to the patient and/or a patient positioning apparatus and also to lock it into place.

Positioning the local coil on the dorsal side of the head and/or the patient's parietal bone enables the provision of a particularly simple technical solution in order to hold the local coil in the specified position relative to the patient's head.

According to a further embodiment, the local coil according to the disclosure further has a second mounting which may be adapted to hold the local coil in the specified relative position on a ventral side of the patient's head, wherein the local coil has at least one further antenna which may be adapted to receive magnetic resonance signals from a dentition of the patient.

In this embodiment, the local coil can have one or more recesses which, when the local coil is positioned appropriately for the application on the ventral side of the patient's head, are positioned at a mouth region and/or a nasal region of the patient. A corresponding recess can in particular be a hole or an opening with any type of cross section which facilitates or improves air exchange between the mouth region and/or the nasal region with the environment, in particular the patient's breathing.

The local coil can in particular be designed to be positioned on either the dorsal side or the ventral side of the patient's head in dependence on a magnetic resonance measurement to be performed. In an exemplary embodiment, the local coil can be deformed by means of the flexible element in such a way that the local coil can be shaped to any surface contour of the patient's head.

The local coil according to the disclosure can have a plurality of mountings which are embodied to hold the local coil in different specified positions relative to the patient's head. The plurality of mountings may be embodied to shape the local coil to different surface contours of the head, such as, for example, the back of the head, the parietal bone and/or the jaw region.

In an exemplary embodiment, the second mounting matches the mounting according to an above-described embodiment. This can mean that the mounting may be adapted to hold the local coil on both the ventral and dorsal side of the patient's bead. Herein, the mounting can have an adjustment mechanism which may be adapted to adjust a geometric shape, a configuration and/or a spatial arrangement of the mounting in dependence on a desired position of the local coil relative to the patient's head (or a desired magnetic resonance measurement of the temporomandibular joint and/or the dentition). For example, the mounting can be positioned rotatably, pivotably or in different configurations and/or in an orientable manner in order to hold the local coil on different sides of the patient's head. In one embodiment, the mounting has a mechanism which may be adapted to change a geometric shape and/or a spatial arrangement of the mounting in order to hold the local coil in the specified relative position on the ventral side, the dorsal side or on the parietal bone of the patient's head.

It is however also conceivable that the local coil according to the disclosure has a first mounting and a second mounting, which are used in dependence on the magnetic resonance examination to be performed. For example, magnetic resonance signals can be acquired from the temporomandibular joint by a first mounting which may be adapted to accommodate the dorsal side of the patient's head and to hold the local coil in the specified relative position on the dorsal side of the head. Similarly, the second mounting can be embodied to hold the local coil in the specified relative position on the ventral side of the patient's head in order to acquire magnetic resonance signals from the dentition of the patient. It is further conceivable that the first mounting and/or the second mounting have a connecting element embodied to connect the first mounting mechanically to the second mounting.

The further antenna can, for example, be a second antenna. In an exemplary embodiment, however, the local coil has a plurality of antennas or arrays of antennas, wherein at least one subset of the plurality of antennas or arrays of antennas is positioned on the jaw region of the patient when the local coil is positioned in the specified relative position on the ventral side of the head.

The provision of a plurality of mountings or one single mounting which may be adapted to hold the local coil on different sides of the patient's head advantageously enables production costs for local coils adjusted to different diagnostically relevant regions of the patient's head to be reduced or avoided. Furthermore, the possibility of positioning the local coil on the back of the patient's head enables any impairment of the patient's face region and/or patient's breathing during a magnetic resonance measurement of a temporomandibular joint to be reduced or avoided.

In a further embodiment, the mounting has a U-shaped indentation which may be adapted to accommodate the dorsal side of the patient's head. When positioned appropriately for the application in the U-shaped indentation, the local coil is positioned on the dorsal side of the patient's head, wherein the section of the local coil with the at least one antenna is positioned on the patient's temporomandibular joint.

A U-shaped indentation can be any indentation with a substantially U-shaped cross section. Herein, a U-shaped indentation can also comprise a V-shaped and/or a C-shaped indentation. For example, a U-shaped indentation can have the shape of a half-shell, in particular a shell-shaped indentation. The half-shell can, for example, be characterized by half of a cut-open sphere, a cut-open cylinder or a cut-open ovoid. However, it is also conceivable that the mounting has a body shape of any kind, such as, for example, a cuboid, a cube, a prism, a polyhedron or the like, with a U-shaped indentation. In an exemplary embodiment, a rounding of the U-shaped indentation may be adapted to accommodate the back of the patient's head. When positioned appropriately for the application in the U-shaped indentation, the head of the patient can be flanked by two substantially parallel extensions of the U-shaped indentation.

However, the two extensions of the U-shaped indentation can also have a curved surface contour and/or be at an angle to one another. In an exemplary embodiment, two sections of the local coil with two antennas are shaped to the two temporomandibular joints of the patient by means of the two extensions of the U-shaped indentation when the patient's head is positioned in the U-shaped indentation appropriately for the application.

In an exemplary embodiment, an inner side of the U-shaped indentation, in particular a side facing the patient when the local coil is positioned appropriately for the application, is shaped like a surface contour of the dorsal side of the patient's head. It is conceivable that the flexible element of the local coil is positioned and/or inserted in the U-shaped indentation according to the disclosure and can be shaped to the surface contour of the dorsal side of the head when the head is positioned in the U-shaped indentation. Thus, when positioned appropriately for the application, the local coil can be clamped or inserted between the mounting and the dorsal side of the head. In an exemplary embodiment, herein, the U-shaped indentation is shaped in such a way that the section of the local coil with the at least one antenna is positioned on the patient's temporomandibular joint. Herein, the section of the local coil with the at least one antenna can be shaped to the surface contour of the temporomandibular joint by means of the mounting.

The provision of a U-shaped indentation enables at least part of the patient's head to be embedded in the mounting in a specified position. This advantageously enables the setting of a relative position between the mounting and the head of the patient during a magnetic resonance measurement to be simplified. Furthermore, positioning the head on the local coil in the U-shaped indentation advantageously enables the flexible element of the local coil to be shaped to the surface contour of the dorsal side of the head. This enables a particularly short distance to be provided between the at least one antenna and the surface contour of the patient's head and the signal-to-noise ratio of the local coil to be advantageously increased.

According to one embodiment, the mounting of the local coil according to the disclosure comprises an adjustment mechanism which may be adapted to variably set a position of the local coil relative to the patient's head in order to coordinate a position of the at least one antenna of the local coil with a position of a diagnostically relevant region of the patient's head.

In one embodiment, the U-shaped indentation of the mounting has a recess which is designed to accommodate at least part of the local coil in the recess. The adjustment mechanism can accordingly be embodied to variably set a position and/or a shape of the local coil in the recess in order to coordinate a position of the at least one antenna of the local coil with a position of the diagnostically relevant region of the patient's head. It is however also conceivable that the mounting has a head rest or a head holder which may be adapted to hold the patient's head at a specified distance from the local coil and also from the U-shaped indentation when positioned appropriately for the application. The adjustment mechanism can accordingly be embodied to adjust a distance between the local coil and the head of the patient in order to coordinate the position of the at least one antenna with the position of the diagnostically relevant region of the head. The diagnostically relevant region can in particular be a temporomandibular joint and/or a section of a patient's spinal column.

The adjustment mechanism can, for example, have a clamping element, a setting element and/or a guide element which are embodied to set a shape and/or a position of at least a part of the local coil. In principle, however, the adjustment mechanism can be embodied as any mechanism that allows the relative position of the local coil and patient's head to be adjusted. The adjustment mechanism can be set manually, semi-automatically or automatically. For this purpose, the adjustment mechanism can in particular have a drive and/or a remote control which enable semi-automatic or automatic setting of the position of the local coil relative to the patient's head.

The adjustment mechanism advantageously enables the position of the at least one antenna to be coordinated with the position of the diagnostically relevant region. The adjustment mechanism in particular enables the position of the at least one antenna to be coordinated with diagnostically relevant regions of a plurality of patients with different head dimensions and/or head shapes.

In a further embodiment, when positioned appropriately for the application on the dorsal side of the patient's head, the local coil according to the disclosure has an electrical connection on a side facing the mounting.

An electrical connection can, for example be embodied as an electrical connecting lead or a plug-in element. An electrical connecting lead can comprise any electrical conductor which may be adapted to establish an electrical signal connection between the at least one antenna of the local coil and a receiver unit of a magnetic resonance apparatus. In an exemplary embodiment, the electrical connecting lead is designed according to an above-described embodiment. A plug-in element can comprise any apparatus which may be adapted to provide an electrically conductive connection to a corresponding or complementary plug-in element by means of a plugging process. It is conceivable that the electrical connection of the local coil is connected by means of the plug-in element to an electrical connecting lead, which is in turn connected to the receiver unit of the magnetic resonance apparatus.

The mounting provides a recess which, when the local coil is positioned appropriately for the application on the mounting, may be adapted to accommodate the electrical connection, so that the side of the local coil facing the mounting can be positioned flush against a surface of the mounting facing the patient.

It is conceivable that the electrical connection stands out or protrudes or sticks out from a surface of the local coil. A recess can be an indentation, an opening, a hole, a compartment and/or a recessed volume which accommodates the electrical connection of the local coil when the local coil is positioned appropriately for the application on the mounting. The recess can in particular be provided in the U-shaped indentation of the mounting. It is conceivable that the recess penetrates at least part of the mounting in order to feed an electrical connecting lead through the mounting. However, the recess can also have a plug-in element designed to complement the electrical connection of the local coil. When the local coil is positioned on the mounting, the plug-in element of the recess can in particular be embodied to establish an electrically conductive connection to the electrical connection of the local coil. It is conceivable that the recess in the mounting is likewise embodied to accommodate an electronic circuit according to an above-described embodiment.

Flush positioning of the local coil on the surface of the mounting facing the patient can mean that the local coil is placed on or shaped to the mounting, in particular the U-shaped indentation of the mounting. Herein, the local coil, with the exception of the recess, can be shaped like a surface contour of the side of the mounting facing the patient and cover this surface contour.

The provision of a recess for the electrical connection, and also the electronic circuit, of the local coil advantageously enables the local coil to be positioned flush against the patient's head and the U-shaped indentation. This ensures the shortest possible distance between the at least one antenna of the local coil and the head of the patient to be ensured.

In a further embodiment, the section of the local coil according to the disclosure which is positioned on the patient's temporomandibular joint comprises a magnetic resonance-active marker. The magnetic resonance-active marker may be adapted to emit a signal which can be mapped by means of a magnetic resonance measurement in order to assist in aligning the section of the local coil with a diagnostically relevant region of the patient's head.

A magnetic resonance-active marker can in principle be an active and/or a passive marker. A passive marker may be excited by means of a radio-frequency signal of the magnetic resonance apparatus. Once the marker has been excited, the marker itself can emit a magnetic resonance signal which can be received by the at least one antenna and/or a further receiving antenna of the magnetic resonance apparatus. On the other hand, an active marker may be adapted to emit radio-frequency signals which can be received directly by the at least one antenna and/or the receiving antenna of the magnetic resonance apparatus. Examples of passive magnetic resonance-active markers are encapsulated fluids, such as fish oil, solutions of vitamins other suitable substances. One example of an active, magnetic resonance-active marker is a coil or an antenna which may be adapted to emit magnetic resonance signals.

It is conceivable that the magnetic resonance apparatus may be adapted to assist positioning of the local coil in dependence on the signal of the magnetic resonance-active marker. For example, the magnetic resonance apparatus can be embodied to provide a user with image data of the magnetic resonance-active marker by means of a display unit so that the user can adjust a position of the local coil. However, it is also conceivable that the magnetic resonance apparatus has a computing unit which may be adapted to ascertain a difference between a current position and a desired position of the local coil in dependence on the signal of the magnetic resonance-active marker and output it to the user. The magnetic resonance-active marker can in particular be mapped by means of a magnetic resonance measurement. This can mean that the signal emitted by the magnetic resonance-active marker has a frequency and power range which can be acquired by a receiver unit of a magnetic resonance apparatus.

Herein, image data can be considered to be all types of data required to create magnetic resonance images of the diagnostically relevant region of the patient's head and which are based on acquired magnetic resonance signals. Image data can in particular comprise k-space data in a k-space matrix. Image data of the magnetic resonance-active marker may be acquired by means of a so-called localizer or navigator measurement (measurement with reduced resolution).

A magnetic resonance-active marker can advantageously assist positioning of the local coil on the patient's head. This can advantageously enable the time required and/or the accuracy of the positioning of the local coil to be increased.

In a further embodiment of the local coil according to the disclosure, the mounting has an elastic element which may be adapted, when the local coil is positioned appropriately for the application on the patient's head, to be positioned between the mounting and the local coil and the local coil to be shaped to the surface contour of the patient's head and/or to hold the local coil in the position appropriate for the application on the patient's head.

The elastic element may be reversibly deformable. The elastic element can in particular be made in one piece from an elastic material. Examples of elastic materials are plastics such as polyethene, polyurethane, polyamide and polyester. In addition, naturally-based materials such as, for example, rubber or fiber materials, are also conceivable. In an exemplary embodiment, the elastic element is made of foam, fibrous material or the like in order to achieve low density and thus a low weight. The elastic element can be deformable in such a way that the elastic element can be shaped like an individual geometry of a surface contour of the patient's head. In an exemplary embodiment, the elastic material can be deformed by means of a manual force applied by an operator of a magnetic resonance apparatus or by the patient.

The elastic element can be embodied to be positioned relative to the mounting and clamped in the mounting under elastic deformation. For example, elastic restoring forces of the elastic element can be selected in such a way that the elastic element forms a force-fitting connection with the mounting, but also with the local coil, by means of the elastic restoring forces. It is in particular conceivable that, when positioned appropriately for the application, the elastic element is positioned or clamped between the mounting and the local coil. Herein, the elastic element can be shaped like the surface contour of the patient's head. The elastic restoring force of the elastic element can in particular be adapted for a specified group of patients, such as, for example, children, adolescents, adults or seniors, so that, when positioned appropriately for the application, the elastic element exerts a specified pressure on the local coil on the jaw region of the patient and/or the dorsal side of the patient. In an exemplary embodiment, positioning the elastic element between the mounting and the local coil causes the local coil to be shaped like the surface contour of the patient's head.

The provision of an elastic element advantageously enables the local coil to be shaped to a surface contour of the patient's head in a particularly time-efficient way.

According to one embodiment, the local coil according to the disclosure has an electrical connecting lead which may be adapted to establish a signal connection to a receiver unit of a magnetic resonance apparatus. Herein, the electrical connecting lead can be designed according to an above-described embodiment.

The electrical connecting lead is pivotably mounted at an exit point on the local coil relative to the local coil in order to avoid inconvenience to the patient by the electrical connecting lead during a magnetic resonance measurement of the temporomandibular joint and/or the dentition. At the exit point, the electrical connecting lead can, for example, have a joint, a bearing or a hinge which may be adapted to change an exit angle, an exit direction or an exit trajectory of the electrical connecting lead at the exit point relative to the local coil. In an exemplary embodiment, the local coil has a rotary joint which may be adapted to rotate the electrical connecting lead at the exit point relative to the local coil. It is conceivable that the electrical connecting lead can be rotated by a maximum angle of 90°, 135°, 180° or 270° relative to the local coil. In some cases, a larger angle can also be appropriate.

An electrical connecting lead at an exit point on the local coil that can be pivoted relative to the local coil enables an exit angle and/or a course of the electrical connecting lead to be set in dependence on a magnetic resonance measurement and/or positioning of the local coil on the patient's head. This advantageously enables the positioning of the local coil on the patient's head to be simplified and/or impairment of the patient, in particular the facial area, by the electrical connecting lead to be reduced or avoided.

In an exemplary embodiment, the local coil according to the disclosure further has a plurality of antennas or arrays of antennas, wherein a plurality of subsets of the plurality of antennas or arrays of antennas in each case have a signal connection to a receiver unit of a magnetic resonance apparatus and can be selectively read by means of the receiver unit.

As described above, the plurality of antennas or the plurality of arrays of antennas can be provided as an array or a matrix. Herein, individual antennas can be arranged adjacent to one another or partially or completely overlap.

In an exemplary embodiment, the subsets of the plurality of antennas or arrays of antennas are connected to individual channels of the receiver unit by means of individual signal connections in order to transmit acquired magnetic resonance signals to the magnetic resonance apparatus. It is in particular conceivable that the at least one antenna which, when positioned appropriately for the application of the local coil is positioned on the dorsal side of the head on the diagnostically relevant region of the head, has a signal connection to a channel of the receiver unit. The magnetic resonance apparatus can accordingly be embodied to read individual channels of the receiver unit in dependence on a magnetic resonance measurement to be performed.

Selectively reading signals from individual antennas or arrays of antennas of the local coil enables the acquisition of magnetic resonance signals to be limited to the diagnostically relevant region of the patient's head. This can advantageously reduce the time required to perform magnetic resonance measurement. Furthermore, the acquisition of magnetic resonance signals can advantageously be limited to an anatomy of the patient which can also be actually diagnosed by a respective medical practitioner, such as, for example, a dentist, an oral surgeon and/or an orthopedic surgeon. This advantageously enables the risk of misdiagnosis to be reduced.

In a further embodiment, the local coil according to the disclosure further has hearing protection which, when the local coil is positioned appropriately for the application on the patient's head, is positioned on an ear of the patient, wherein the hearing protection may be adapted to reduce a sound level at the patient's ear.

Hearing protection can have any type of sound-absorbing element. The sound-absorbing element may be embodied to attenuate or break incoming sound waves. The sound-absorbing element can likewise be embodied to emit a sound wave with a phase that is opposite to a phase of an incoming sound wave. Thus, the incoming sound wave can be at least partially extinguished or attenuated by interference.

In an exemplary embodiment, the hearing protection is connected to the local coil in such a way that, when the local coil is positioned appropriately for the application on the patient's head, the hearing protection is positioned over an ear of the patient. The hearing protection can be attached to the local coil by means of any type of mechanical connection, for example a force-fitting, material-bonded and/or a form-fitting connection. In an exemplary embodiment, the mechanical connection may be adapted to reversibly connect the hearing protection to the local coil.

The provision of hearing protection advantageously enables the patient's exposure to noise during the magnetic resonance measurement to be reduced. This advantageously enables the abortion of the magnetic resonance measurement to be avoided in the case of acoustically sensitive and/or anxious patients. Furthermore, the hearing protection can provide a reference point which advantageously simplifies positioning of the local coil on the patient's head.

The magnetic resonance apparatus according to the disclosure comprises a local coil according to an above-described embodiment. The magnetic resonance apparatus according to the disclosure has a signal connection to the local coil, wherein the magnetic resonance apparatus may be adapted to acquire magnetic resonance signals from a diagnostically relevant region of the patient's head by means of the local coil.

The magnetic resonance apparatus can additionally comprise a mounting according to an above-described embodiment. The mounting can be embodied to position and/or hold the local coil on a dorsal and/or ventral side of a patient's head. The mounting can further be mechanically connected to the magnetic resonance apparatus, in particular a patient positioning apparatus and/or a patient table. However, it is also conceivable that the mounting is a separate component from the magnetic resonance apparatus. In this case, the mounting can be mounted on a wall and/or ceiling of an examination room of the magnetic resonance apparatus or attached reversibly to the patient positioning apparatus. In an exemplary embodiment, the mounting has a positioning unit which may be adapted to set a position of the mounting and/or the local coil relative to the patient positioning apparatus and/or the patient. It is further conceivable that the positioning unit is configured to set a spatial position and/or orientation of the local coil and/or the mounting.

Furthermore, the magnetic resonance apparatus according to the disclosure has at least one electrical connecting lead which is configured to electrically connect an antenna of the local coil to a receiver unit of the magnetic resonance apparatus. In one embodiment, the local coil has one or more antennas embodied as a transmitting antenna. The transmitting antenna can be connected by means of an electrical connecting lead to a transmitter unit of the magnetic resonance apparatus. It is conceivable that the transmitter unit provides an alternating current which is emitted as a radio-frequency signal from the transmitting antenna into a volume of the patient's head, so that a B1 magnetic field is generated. In a further embodiment, the local coil has one or more antennas embodied as a receiving antenna. The receiving antenna can be connected to the receiver unit of the magnetic resonance apparatus by means of an electrical connecting lead. Thus, the magnetic resonance apparatus is able to receive magnetic resonance signals from a diagnostically relevant region of the patient's head and to reconstruct magnetic resonance images in dependence on the received magnetic resonance signals. For this purpose, the magnetic resonance apparatus can further have a computing unit configured to reconstruct image data in dependence on the acquired magnetic resonance signals.

The magnetic resonance apparatus according to the disclosure advantageously enables time-efficient and repeatable recording of magnetic resonance images of the diagnostically relevant region of the patient's head. The magnetic resonance apparatus according to the disclosure shares the advantages of the local coil according to the disclosure according to an above-described embodiment.

According to a further embodiment, the magnetic resonance apparatus according to the disclosure comprises a receiver unit and a control unit, wherein the control unit may be adapted to selectively read magnetic resonance signals from subsets of the plurality of antennas or arrays of antennas of the local coil by means of the receiver unit in order to restrict the acquisition of image data to the diagnostically relevant body region of the patient.

The receiver unit can in particular comprise a plurality of channels which have signal connections to a plurality of subsets of the plurality of antennas or arrays of antennas of the local coil. In an exemplary embodiment, the control unit may be adapted to actively switch or read individual channels in dependence on a magnetic resonance measurement to be performed in order to restrict the acquisition of magnetic resonance signals to one or more antennas on a diagnostically relevant body region. In one example, the local coil comprises at least one first antenna and one second antenna. When the local coil is positioned appropriately for the application on a dorsal side of a patient's head, the first antenna can be positioned on a patient's right temporomandibular joint, while the second antenna is positioned on a patient's left temporomandibular joint. Accordingly, the first antenna can have a signal connection to a first channel of the receiver unit, while the second antenna has a signal connection to a second channel of the receiver unit. The control unit (e.g., controller) may be embodied to restrict the reading of magnetic resonance signals during a magnetic resonance measurement of the patient's temporomandibular joints to the first channel and the second channel of the receiver unit.

The magnetic resonance apparatus according to the disclosure and the local coil according to the disclosure advantageously enables the acquisition of image data by means of the magnetic resonance measurement to be adjusted to the diagnostically relevant region of the patient's head.

In one embodiment, the magnetic resonance apparatus according to the disclosure further has a computing unit, wherein the computing unit may be adapted to receive patient information and to ascertain a desired position of the local coil relative to the patient's head in dependence on the patient information, wherein the magnetic resonance apparatus has a drive which may be adapted to position the local coil by means of the adjustment mechanism in the desired position relative to the patient's head in order to coordinate the position of the at least one antenna of the local coil with a position of a diagnostically relevant region of the patient's head.

In an exemplary embodiment, the computing unit has an interface which may be adapted to receive patient information from a source, such as, for example, a memory unit of the magnetic resonance apparatus, a radiology information system and/or a hospital information system. Obviously, the interface can also receive the patient information from any further sources that store and/or process patient information. Patient information can be characterized by any data that includes an indication of a demographic background, a physical attribute and/or a patient's medical history. Examples of such data are height, gender, age, weight, but in particular head shape, jaw dimensions, head dimensions and the like.

The computing unit may be embodied to ascertain a position of the local coil relative to the patient's head in dependence on the patient information and a magnetic resonance measurement to be performed. Herein, the ascertained position of the local coil relative to the patient's head can, for example, relate to a position and/or orientation of the local coil on the dorsal or ventral side of the head. Furthermore, the ascertained relative position can relate to a distance and/or a curvature of at least part of the local coil relative to a surface contour of the patient's head.

It is conceivable that the computing unit and/or the control unit are adapted to provide a control signal which is transmitted to the drive. The drive may be embodied to set the adjustment mechanism in order to adjust a position of the local coil relative to the patient's head. Here, in particular the position of the at least one antenna of the local coil is automatically coordinated in dependence on the patient information with the position of the diagnostically relevant region of the patient's head. The drive can, for example, be embodied as a pneumatic, hydraulic or electric drive.

The magnetic resonance apparatus according to the disclosure enables part of a process of positioning the local coil on the patient's head to be automated in dependence on the patient information. This advantageously enables errors in manual positioning of the local coil to be reduced or avoided and/or particularly robust or reproducible positioning of the local coil on the patient's head to be ensured.

FIG. 1 is a schematic depiction of a possible embodiment of a magnetic resonance apparatus 10 according to the disclosure with a local coil 26 according to the disclosure. The magnetic resonance apparatus 10 may include a magnet unit 11, which, for example, has a permanent magnet, an electromagnet or a superconducting main magnet 12 for generating a strong and in particular homogeneous basic magnetic field 13 (B0 magnetic field). In addition, the magnetic resonance apparatus 10 comprises a patient receiving area 14 for receiving a patient 15. In the present exemplary embodiment, the patient receiving area 14 is cylindrical in shape and is enclosed by the magnet unit 11 in a circumferential direction. In principle, however, embodiments of the patient receiving area 14 that deviate from this example are also conceivable.

The patient 15 can be positioned in the patient receiving area 14 by means of a patient positioning apparatus 16 of the magnetic resonance apparatus 10. For this purpose, the patient positioning apparatus 16 has a patient table 17 designed to be movable within the patient receiving area 14. The magnet unit 11 furthermore has a gradient coil 18 for generating magnetic gradient fields which is used for a spatial encoding during a magnetic resonance measurement. The gradient coil 18 is actuated by means of a gradient control unit 19 of the magnetic resonance apparatus 10. The magnet unit 11 can furthermore comprise a radio-frequency antenna, which, in the present exemplary embodiment, is embodied as a body coil 20 that is permanently integrated into the magnetic resonance apparatus 10. The body coil 20 is designed to excite atomic nuclei that are located in the basic magnetic field 13 generated by the main magnet 12. It is conceivable that the local coil 26 has a magnetic resonance-active marker 51, in particular a capsule containing fish oil or a vitamin solution, which can be excited by means of the body coil 20 in order to emit magnetic resonance signals. The body coil 20 is actuated by a radio-frequency unit 21 of the magnetic resonance apparatus 10 which is embodied as a transmitter unit and radiates radio-frequency signals into an examination room which is substantially formed by a patient receiving area 14 of the magnetic resonance apparatus 10. The body coil 20 can furthermore also be embodied to receive magnetic resonance signals. For this purpose, the radio-frequency unit 21 can also be embodied as a receiver unit with one or more channels which are connected to one or more antennas of the local coil 26 by means of the electrical connecting lead 27. In an exemplary embodiment, the control unit (controller) 22 and/or the computing unit (computer) 28 may be adapted to limit the reading of magnetic resonance signals to one or more channels of the receiver unit in dependence on a magnetic resonance measurement to be performed in order to restrict the acquisition of image data to a volume of a diagnostically relevant region of the head 43 of the patient 15.

The magnetic resonance apparatus 10 has a control unit 22 for controlling the main magnet 12, the gradient control unit 19 and the radio-frequency unit 21. The control unit (controller) 22 may be adapted to control the performance of a sequence, such as, for example, an imaging gradient echo sequence, a TSE sequence or a UTE sequence. In addition, the control unit 22 comprises a computing unit (computer) 28 for evaluating digitized magnetic resonance signals that are acquired during the magnetic resonance measurement.

Moreover, the magnetic resonance apparatus 10 comprises a user interface 23 which has a signal connection to the control unit 22. Control information, such as, for example, imaging parameters and reconstructed magnetic resonance images, can be displayed to a user on a display unit 24, for example on at least one monitor, of the user interface 23. Furthermore, the user interface 23 has an input unit 25 by means of which the user can input parameters of a magnetic resonance measurement.

In the present case, the local coil 26 according to the disclosure is positioned in the position appropriate for the application on the dorsal side of the patient's head 15 (see also FIG. 2) in order to transmit magnetic resonance signals from a temporomandibular joint 42 of the patient 15 to the magnetic resonance apparatus 10. For this purpose, the head 43 of the patient 15 is positioned in a U-shaped indentation of a mounting 35 of the local coil 26. The local coil 26 is connected to the radio-frequency unit 21 by means of the electrical connecting lead 27. Like the body coil 20, the local coil 26 can also be embodied to excite atomic nuclei and to receive magnetic resonance signals. In order to emit radio-frequency signals, a transmitting antenna of the local coil 26 is actuated by the radio-frequency unit 21.

In the representation shown, the local coil 26 encloses the head 43 of the patient 15 along a segment of an imaginary are around the head 43 of the patient 15. In FIG. 1, a center point angle which determines the segment of the imaginary arc is approximately 180° to 210°. Herein, the mounting 35 may be adjusted to an outer shape of the head 43 of the patient 15.

The magnetic resonance apparatus 10 represented can obviously comprise further components usually found in magnetic resonance apparatuses. It is also conceivable that, instead of the cylindrical structure, the magnetic resonance apparatus 10 has a C-shaped, triangular or asymmetric structure of the magnetic field-generating components. The magnetic resonance apparatus 10 can in particular be a dedicated magnetic resonance apparatus 10 which may be adapted to perform a magnetic resonance measurement of a diagnostically relevant region of the head 43 of a standing or seated patient 15.

FIG. 2 shows an embodiment of the local coil 26 in which the mounting 35 has a U-shaped indentation. The U-shaped indentation is designed in such a way that, when the dorsal side 41 of the head 43 is positioned in the U-shaped indentation, the local coil 26 is shaped to the surface contour of the head 43 of the patient 15. In the present case, the local coil 26 consists of a flexible element, such as, for example, an elastic foam or an elastomer, which is adjusted to the surface contour of the head 43 of the patient 15 in order to enable the shortest possible distance between an antenna 32 (see FIG. 3) of the local coil 26 and a diagnostically relevant region of the head 43. The local coil 26 has at least one antenna (see FIG. 3) which is embedded in the flexible element.

The arrangement of the local coil 26 on the head 43 of the patient 15 shown in FIG. 2 may be used for a magnetic resonance measurement of a temporomandibular joint 42 and/or a section of a spinal column of the patient 15. For this purpose, the local coil 26 is positioned on the dorsal side 41 of the head 43 of the patient 15 between the mounting 35 and a surface of the head 43. The local coil 26 can further be positioned on a parietal bone of the patient 15. Herein, the mounting 35 can wrap round the patient's parietal bone 15 like a headset.

FIG. 3 shows an embodiment of the local coil 26 according to the disclosure in which the sections 26*a* and 26*b* of the local coil 26 with the antennas 32*a* and 32*b* are positioned on the temporomandibular joints 42*a* and 42*b* of the patient 15 by means of the mounting 35. The local coil 26 additionally has an adjustment mechanism 50 which may be adapted to set a position of the local coil 26 relative to the head 43 of the patient 15, but also a shape of the local coil 26. For example, the adjustment mechanism 50 is configured to move the local coil 26 along the Y-direction relative to the head 43 of the patient 15 in the U-shaped indentation. However, it is also conceivable that the adjustment mechanism 50 may be adapted to deform the local coil 26, in particular the flexible element of the local coil 26, in such a way that at least one antenna 32 is positioned on a diagnostically relevant region of the head 43 of the patient 15, such as, for example, a temporomandibular joint 42. Herein, the head 43 of the patient 15 can be supported by a dedicated head holder 53 which provides a distance (for example defined by a dimension of the recess or the gap 57 along the Y-direction) between the surface contour of the dorsal side 41 of the head 43 and the bottom of the U-shaped indentation. It is however also conceivable that the U-shaped indentation has an additional recess 57. In this case, the additional recess 57 can be designed to accommodate at least one part of the adjustment mechanism 50 and/or to provide an extended space for positioning the local coil 26.

In one embodiment, the computing unit 28 of the magnetic resonance apparatus 10 may be adapted to retrieve patient information for the patient 15, which in particular comprises an indication of the shape and/or dimension of the head 43 of the patient 15, from a memory unit of a hospital information system and/or a radiology information system. The computing unit 28 and/or the control unit 22 can further be embodied to actuate the adjustment mechanism 50 in dependence on the patient information in order to automatically coordinate the position of the antennas 32*a* and 32*b* with the position of the temporomandibular joints 42*a* and 42*b*. However, obviously, the adjustment mechanism 50 can also be set manually, for example by a user of the magnetic resonance apparatus 10.

In an exemplary embodiment, the antennas 32*a* and 32*b* are connected to dedicated channels of the receiver unit of the magnetic resonance apparatus by means of the connecting lead 27. The control unit 22 can be designed to restrict the reading of magnetic resonance signals during a magnetic resonance measurement of the temporomandibular joints 42*a* and 42*b* to the channels of the receiver unit which are connected to the antennas 32*a* and 32*b*.

FIG. 4 shows an embodiment of the local coil 26 according to the disclosure in which the mounting 35 has a recess 57 for accommodating the electrical connecting lead 27 of the local coil 26. In the present case, the recess 57 is integrated into the U-shaped indentation of the mounting 35 and designed in such a way that the electrical connecting lead 27 at the exit point 54 of the local coil 26, but also an electronic circuit (comprising for example electronic components, a standing wave barrier, etc.) of the antenna or the connecting lead 27, are accommodated in the recess 57 when the local coil 26 is positioned appropriately for the application.

In one embodiment, the local coil 26 has a rotary joint 55, at the exit point 54, which enables the electrical connecting lead 27 to swivel and/or rotate relative to the local coil 26 at the exit point 54.

In an alternative embodiment, the mounting 35 has a plug-in element in the recess 57 which is designed to complement a plug-in element on the local coil 26 (not shown) and may be adapted to provide an electrical connection between an antenna of the local coil 26 and the radio-frequency unit 21 when the plug-in element of the local coil 26 engages in the plug-in element of the mounting 35 when the local coil 26 is positioned appropriately for the application.

FIG. 5 shows an embodiment in which the local coil 26 according to the disclosure is positioned in the position appropriate for the application on the ventral side 40 of the head 43 of the patient 15. Accordingly, the mounting 35*b* may be adapted to hold the local coil 26 on the ventral side 40 of the head 43 and to shape the flexible element of the local coil 26 like a jaw region 44 of the patient 15. Herein, the mounting 35*b* can represent a second mounting according to an above-described embodiment.

In the present case, the mounting 35*b* has an elastic element 56 which is elastically deformed when the local coil 26 is positioned appropriately for the application on the jaw region 44. Herein, elastic restoring forces of the elastic element 56 that occur may be adapted to be large enough to hold the local coil 26 on the jaw region 44 of the patient 15 and to shape the local coil 26 to the surface contour of the jaw region 44. The elastic element 56 can in particular consist of an elastic foam and have one or more parts. It is additionally conceivable that the elastic element 56 has a plurality of springs which are mounted in cylindrical sleeves and can be elastically compressed in the direction of the mounting 35*b* starting from the jaw region 44 of the patient 15. The springs can be embodied to be compressed during positioning of the mounting 35*b* or the local coil 26 and to shape the local coil 26 to a surface contour of the ventral side 40 of the head 43. Furthermore, the springs and/or the cylinder sleeves can be embodied to hold the local coil 26 in the position appropriate for the application on the jaw region of the patient 15.

In the example shown, the mounting 35*b* is positioned on the patient table 17 of the patient positioning apparatus 16. However, it is also conceivable that the mounting 35*b* is positioned on a wall or a ceiling of an examination room or on a support structure of the magnetic resonance apparatus 10 in order to enable a magnetic resonance measurement of a standing or seated patient 15. The mounting 35*b* can have two support elements 30*a* and 30*b* which flank the head 43 of the patient 15 from two sides or have an indentation which is designed to accommodate the ventral side of the head 43 of the patient 15.

FIG. 6 shows an embodiment in which the mounting 35 of the local coil 26 according to the disclosure is composed of two mountings 35*a* and 35*b*. The mountings 35*a* and 35*b* can in particular be reversibly mechanically connected (see dashed line) to one another. Herein, the mounting 35*a* can represent a first mounting according to an above-described embodiment.

In the present representation, the local coil 26 is held on the jaw region of the patient 15 by both the mounting 35*a* and the elastic element 56 and shaped like the surface contour of the jaw region 44. Herein, it is conceivable that the mounting 35*a* and/or the mounting 35*b* have a recess 57, an adjustment mechanism 50 and/or a connecting lead 27 that can be pivoted on the exit point 54 according to an above-described embodiment.

One advantage of the present local coil 26 is that the local coil 26 can be easily inserted in the U-shaped indentation of the mounting 35 during a magnetic resonance measurement of a temporomandibular joint 42 of the patient 15, thus advantageously enabling any impairment of the field of vision and/or a facial region of the patient 15 to be avoided.

It is however conceivable that a U-shaped indentation is dispensed with. As shown in FIG. 7, the mounting 35 can have two support elements 30*c* and 30*d* which flank the head 43 of the patient 15 from two opposite sides. Herein, the dorsal side 41 of the head 43 of the patient 15 can be positioned on a cushion or pad on which the local coil 26 is also positioned. Furthermore, the cushion or pad can also be provided by the local coil 26 itself.

Although the disclosure has been illustrated and described in more detail by the exemplary embodiments, the disclosure is nevertheless not restricted by the disclosed examples and other variations can be derived herefrom by the person skilled in the art without departing from the scope of protection of the disclosure.

The invention claimed is:

1. A local coil, comprising:

a mounting adapted to: position the local coil in a position relative to a head of a patient, and hold the local coil in the relative position on a dorsal side of the head and/or a parietal bone of the patient;

at least one antenna adapted to receive radio-frequency (RF) signals in a frequency and power range of a magnetic resonance (MR) measurement, the at least one antenna being positioned on a temporomandibular joint of the patient; and a flexible element adapted to enable the local coil to be shaped to a surface contour of the head of the patient, wherein:

the local coil is adapted to at least partially enclose the head of the patient when positioned for application of the MR measurement; and a section of the local coil with the at least one antenna is adapted to be positioned on a temporomandibular joint of the patient by the mounting; and the local coil is adapted to receive, using the at least one antenna, MR signals from the temporomandibular joint of the patient.

2. The local coil as claimed in claim 1, further comprising:

a second mounting adapted to hold the local coil in the relative position on a ventral side of the head of the patient; and at least one further antenna adapted to receive MR signals from a dentition of the patient.

3. The local coil as claimed in claim 1, wherein:

the mounting comprises a U-shaped indentation adapted to receive the dorsal side of the head of the patient, when positioned for the application, the local coil is positioned in the U-shaped indentation on the dorsal side of the head of the patient, and the section of the local coil with the at least one antenna is positioned on the temporomandibular joint of the patient.

4. The local coil as claimed in claim 1, wherein the mounting comprises an adjustment mechanism adapted to variably set a position of the local coil relative to the head of the patient to coordinate a position of the at least one antenna of the local coil with a position of a diagnostically relevant region of the head of the patient.

5. The local coil as claimed in claim 3, wherein, when positioned for the application on the dorsal side of the head of the patient, the local coil establishes an electrical connection on a side of the local coil facing the mounting, and wherein the mounting provides a recess adapted to accommodate the electrical connection when the local coil is positioned for the application on the mounting such that the side of the local coil facing the mounting is positionably flush against a surface of the mounting facing the patient.

6. The local coil as claimed in claim 2, wherein the section of the local coil which is positioned on the temporomandibular joint of the patient comprises a MR-active marker adapted to emit a signal mappable by a MR measurement to assist in aligning the section of the local coil with a diagnostically relevant region of the head of the patient.

7. The local coil as claimed in claim 2, wherein the mounting comprises an elastic element which, when the local coil is positioned for the application on the head of the patient, is adapted to:

be positioned between the mounting and the local coil; and shape the local coil to the surface contour of the head of the patient and/or hold the local coil in the position appropriate for the application on the head of the patient.

8. The local coil as claimed in claim 1, wherein the local coil comprises an electrical connecting lead which is adapted to establish a signal connection to a receiver of a MR apparatus, the electrical connecting lead being pivotably mounted at an exit point on the local coil relative to the local coil.

9. The local coil as claimed in claim 1, further comprising a plurality of antennas or arrays of antennas, wherein a plurality of subsets of the plurality of antennas or arrays of antennas, in each case, include a signal connection to a receiver of a MR apparatus are adapted to be selectively read by the receiver.

10. The local coil as claimed in claim 1, further comprises hearing protection which, when the local coil is positioned for the application on the head of the patient, is adapted to be positioned on an ear of the patient, the hearing protection being adapted to reduce a sound level at the ear of the patient.

11. A magnetic resonance (MR) apparatus comprising:

a local coil as claimed in claim 1; and a signal connection to the local coil, wherein the MR apparatus is adapted to acquire, using the local coil, MR signals from a diagnostically relevant region of a head.

12. The magnetic resonance apparatus as claimed in claim 11, further comprising:

a receiver and a controller, wherein:

the local coil comprises a plurality of antennas or arrays of antennas; and the controller is adapted to selectively read, using the receiver, MR signals from subsets of the plurality of antennas or arrays of antennas to restrict acquisition of image data to the diagnostically relevant region of the patient.

13. The magnetic resonance apparatus as claimed in claim 11, wherein:

the mounting comprises an adjustment mechanism adapted to variably set a position of the local coil relative to the head of the patient to coordinate a position of the at least one antenna of the local coil with a position of a diagnostically relevant region of the head of the patient; and the MR apparatus further comprising:

a computer adapted to receive patient information and to ascertain the position of the local coil relative to the head of the patient based on the patient information, and a drive adapted to position the local coil, using the adjustment mechanism, in the position relative to the head of the patient to coordinate the position of the at least one antenna of the local coil with the position of a diagnostically relevant region of the head of the patient.

14. The local coil as claimed in claim 1, wherein the mounting is configured to position the at least one antenna on the temporomandibular joint such that a ventral side of the patient is not affected by either the mounting or the local coil.

15. The local coil as claimed in claim 1, wherein the mounting is adapted to position the local coil in the relative position such that the patient's face is completely free of parts of the local coil.

16. The local coil as claimed in claim 1, wherein, when positioned for the application on the dorsal side of the head of the patient, the local coil establishes an electrical connection on a side of the local coil facing the mounting, and wherein the mounting provides a recess adapted to accommodate the electrical connection when the local coil is positioned for the application on the mounting such that the side of the local coil facing the mounting is positionably flush against a surface of the mounting facing the patient.

* * * * *